US012618869B2

(12) United States Patent
Yoon et al.

(10) Patent No.: US 12,618,869 B2
(45) Date of Patent: May 5, 2026

(54) ROTATING BODY INSPECTION DEVICE FOR ELECTRIFICATION COMPONENT

(71) Applicant: VIEWON CO., LTD., Seoul (KR)

(72) Inventors: Young Wook Yoon, Gyeonggi-do (KR); Young Yeop Yoon, Gyeonggi-do (KR)

(73) Assignee: VIEWON CO., LTD., Seoul (KR)

( * ) Notice: Subject to any disclaimer, the term of this patent is extended or adjusted under 35 U.S.C. 154(b) by 17 days.

(21) Appl. No.: 18/693,852

(22) PCT Filed: Dec. 19, 2022

(86) PCT No.: PCT/KR2022/020696
§ 371 (c)(1),
(2) Date: Mar. 20, 2024

(87) PCT Pub. No.: WO2023/121169
PCT Pub. Date: Jun. 29, 2023

(65) Prior Publication Data
US 2024/0393365 A1 Nov. 28, 2024

(30) Foreign Application Priority Data
Dec. 23, 2021 (KR) ........................ 10-2021-0186599

(51) Int. Cl.
*G01R 1/07* (2006.01)
*G01R 1/067* (2006.01)
*G01R 31/34* (2020.01)

(52) U.S. Cl.
CPC ......... *G01R 1/06705* (2013.01); *G01R 1/071* (2013.01); *G01R 31/346* (2013.01)

(58) Field of Classification Search
CPC .. G01M 13/025; G01M 13/023; G01R 1/071; G01R 31/2893
(Continued)

(56) References Cited

U.S. PATENT DOCUMENTS 11,466,775 B2 * 10/2022 Herse ................... G05D 1/0231
2003/0071167 A1 * 4/2003 Thomassey ......... B64C 29/0033
244/6

(Continued)

FOREIGN PATENT DOCUMENTS

CN 103575533 A 2/2014
CN 207197438 U 4/2018
(Continued)

OTHER PUBLICATIONS

KIPO, Application No. PCT/KR2022/020696, International Search Report and Written Opinion dated Mar. 24, 2023.
(Continued)

*Primary Examiner* — Roberto Velez

(74) *Attorney, Agent, or Firm* — Fitch, Even, Tabin & Flannery LLP

(57) ABSTRACT

Provided is a rotating body inspection apparatus for an electrification component, the rotating body inspection apparatus including a main sprocket on which a rotating body is seated and which is shaped as a disk and rotates, a sub sprocket shaped as a disk and rotating, a connection portion connecting the main sprocket to the sub sprocket, and a linear conversion portion which is connected to the sub sprocket and which converts a rotational movement into a linear movement, wherein a diameter of the sub sprocket is less than a diameter of the main sprocket.

5 Claims, 7 Drawing Sheets

(58) Field of Classification Search
USPC ............................... 324/754.23, 513, 757.01
See application file for complete search history.

(56) References Cited

U.S. PATENT DOCUMENTS

| | | | |
|---|---|---|---|
| 2005/0068544 A1* | 3/2005 | Doemens | ........... G01B 11/2522 |
| | | | 356/601 |
| 2019/0120021 A1* | 4/2019 | Steele | ..................... E21B 23/12 |
| 2021/0288563 A1 | 9/2021 | Lee | |

FOREIGN PATENT DOCUMENTS

| | | | |
|---|---|---|---|
| KR | 10-2009-0120383 A | 11/2009 | |
| KR | 10-2011-0065195 A | 6/2011 | |
| KR | 10-2012-0137691 A | 12/2012 | |
| KR | 10-1767419 B1 | 8/2017 | |
| KR | 10-2021-0060112 A | 5/2021 | |
| KR | 10-2322361 B1 | 11/2021 | |
| KR | 10-2421124 B1 | 7/2022 | |

OTHER PUBLICATIONS

KIPO; Application No. 10-2021-0186599; Request for the Submission of an Opinion dated Jan. 27, 2022.
KIPO; Application No. 10-2021-0186599; Written Decision on Registration dated Apr. 26, 2022.

* cited by examiner

Prior Art

ROTATING BODY INSPECTION DEVICE FOR ELECTRIFICATION COMPONENT

CROSS-REFERENCE TO RELATED APPLICATIONS

This application is a U.S. national phase application filed under 35 U.S.C. § 371 of International Application PCT/KR2022/020696, filed Dec. 19, 2022 which is based upon and claims the benefit of priority from the prior Korean Application No. 10-2021-018659, filed Dec. 23, 2021.

FIELD

The present disclosure relates to a rotating body inspection apparatus for an electrification component, and more particularly, to a rotating body inspection apparatus for an electrification component, wherein a diameter of a sub sprocket is less than a diameter of a main sprocket and an origin sensor and a position limit sensor are provided in a linear conversion portion to measure a position of the main sprocket.

BACKGROUND

Due to the recent surge in demand for electric vehicles, the demand for electrification components is increasing. Accordingly, inspection of components in a mass production system of electrification components is actively underway. Electrification components generally include rotating bodies, and thus, inspection apparatuses suitable for inspecting rotating bodies have been developed.

In general, an electrification component includes hairpins repeatedly formed in a circumferential direction, and in order to precisely inspect them, a rotating body is repeatedly rotated by 360 degrees or more in an inspection apparatus.

An optical system for precise inspection of a state of a hairpin includes a large optical system and a lighting system, and an adjusting instrument for precisely adjusting a position of the optical system has a considerable weight. Moreover, such an inspection apparatus for an electrification component is often mounted on an existing mass production facility, resulting in a limited available space.

FIG. 1 shows a conventional inspection apparatus. A rotating body of an electrified component may be rotated while being seated on a sprocket, and at this time, an origin sensor and a position limit sensor for detecting a rotation angle of the sprocket are used.

The origin sensor may detect a position at which the sprocket starts initial rotation and a position to which the sprocket rotates one turn (360 degrees). The position limit sensor may detect a position to which the sprocket rotates by one or more turns (e.g., 380 degrees) to limit the rotation of the sprocket.

When the rotating body of the electrification component is inspected, the rotating body rotates by an angle greater than 360 degrees, and thus, overlapping may occur between the origin sensor and the position limit sensor in the case of use of one sprocket. Thus, as shown in FIG. 1, the conventional inspection apparatus uses two sprockets.

Referring to FIG. 1, the conventional inspection apparatus includes a main sprocket 10 on which a rotating body is seated and a sub sprocket 20 connected to the main sprocket 10 through a chain 30. The sub sprocket 20 may include an origin sensor and a position limit sensor, and detect a rotating position of the main sprocket 10 through the origin sensor and the position limit sensor included in the sub sprocket 20.

As described above, when the rotating body of the electrification component is inspected, the rotating body rotates by an angle greater than 360 degrees, and thus, the diameter of the sub sprocket 20 needs to be greater than the diameter of the main sprocket 10.

The diameter of the sub sprocket 20 has to be greater than that of the main sprocket 10, but overlapping may not occur between the origin sensor for sensing one turn (360 degrees) of the rotating body and the position limit sensor for sensing one or more turns (e.g., 380 degrees) of the rotating body.

More specifically, the diameter of a circumference of the sub sprocket 20 needs to be greater than a rotation angle (e.g., 380 degrees) of one or more turns required for the rotating body, but overlapping between the origin sensor and the position limit sensor may be prevented from occurring.

However, as the diameter of the sub sprocket 20 increases, the size of the inspection apparatus also increases, raising a manufacturing cost and degrading space utilization. Moreover, as the diameter of the sub sprocket 20 increases, the main sprocket 10 cannot be rotated at high speed, increasing a basic track time.

In addition, when the rotation angle of one or more turns required for the rotating body needs to be increased, a new sub sprocket has to be manufactured because the sub sprocket may be unavailable, and the diameter of the sub sprocket may not be unlimitedly increased depending on the rotation angle of one or more turns required for the rotating body due to space constraints.

SUMMARY

The present disclosure provides a rotating body inspection apparatus for an electrification component, wherein a diameter of a sub sprocket is less than a diameter of a main sprocket and an origin sensor and a position limit sensor are provided in a linear conversion portion to measure a position of the main sprocket.

A rotating body inspection apparatus for an electrification component includes a main sprocket on which a rotating body is seated and which is shaped as a disk and rotates, a sub sprocket shaped as a disk and rotating, a connection portion connecting the main sprocket to the sub sprocket, and a linear conversion portion which is connected to the sub sprocket and which converts a rotational movement into a linear movement, in which a diameter of the sub sprocket is less than a diameter of the main sprocket.

The rotating body inspection apparatus for the electrification component may further include an image capturing unit provided on the main sprocket and photographing the rotating body seated on the main sprocket and a lighting unit irradiating light to the rotating body seated on the main sprocket.

The linear conversion portion of the rotating body inspection apparatus for the electrification component may include a rotation portion connected to the sub sprocket and rotating by the sub sprocket and a linear portion connected to the rotation portion and making linear reciprocating movement in response to a rotation of the rotation portion, and the sub sprocket may rotate in response to a rotation of the main sprocket, and the linear portion may make linear reciprocating movement in response to a rotation of the sub sprocket.

The rotation portion of the rotating body inspection apparatus for the electrification component may include a ball screw, and the linear portion may include a linear motion (LM) guide.

The rotating body Inspection apparatus for the electrification component may further include an origin sensor configured to measure a position of a first point at which the linear portion is located according to the linear reciprocating movement of the linear portion and a position limit sensor configured to measure a position of a second point at which the linear portion is located according to the linear reciprocating movement of the linear portion.

The first point at which the linear portion of the rotating body inspection apparatus for the electrification component is located may be a position of the linear portion corresponding to a point in time at which the main sprocket starts rotating, and the second point at which the linear portion is located may be a position of the linear portion corresponding to a point in time at which the main sprocket rotates by 370 degrees to 390 degrees.

The origin sensor and the position limit sensor of the rotating body inspection apparatus for the electrification component may be disposed in a direction parallel to an axial direction in which the linear portion moves, and a position of any one or more of the origin sensor and the position limit sensor may be changeable according to a rotation angle of the rotating body.

A distance between the origin sensor and the position limit sensor of the rotating body inspection apparatus for the electrification component may be equal to 1.027 times to 1.083 times of a product of a diameter (D1) of the main sprocket with respect to a diameter (D2) of the sub sprocket and a distance the linear portion moves by one turn of a rotation of the sub sprocket.

The present disclosure may provide a rotating body inspection apparatus for an electrification component, wherein a diameter of a sub sprocket is less than a diameter of a main sprocket and an origin sensor and a position limit sensor are provided in a linear conversion portion, thereby being possible to reduce the size of the rotating body inspection apparatus for the electrification component and making it easy to mount sensors thereon.

The present disclosure may also allow the main sprocket to rotate at high speed by making the diameter of the sub sprocket less than the diameter of the main sprocket, thereby minimizing a track time.

Moreover, according to the present disclosure, a position of any one of the origin sensor and the position limit sensor may be changed according to a rotation angle required for the rotating body, thereby removing a need for manufacturing a new sub sprocket due to a change in the rotation angle required for the rotating body.

MODE FOR INVENTION

Figure 1:
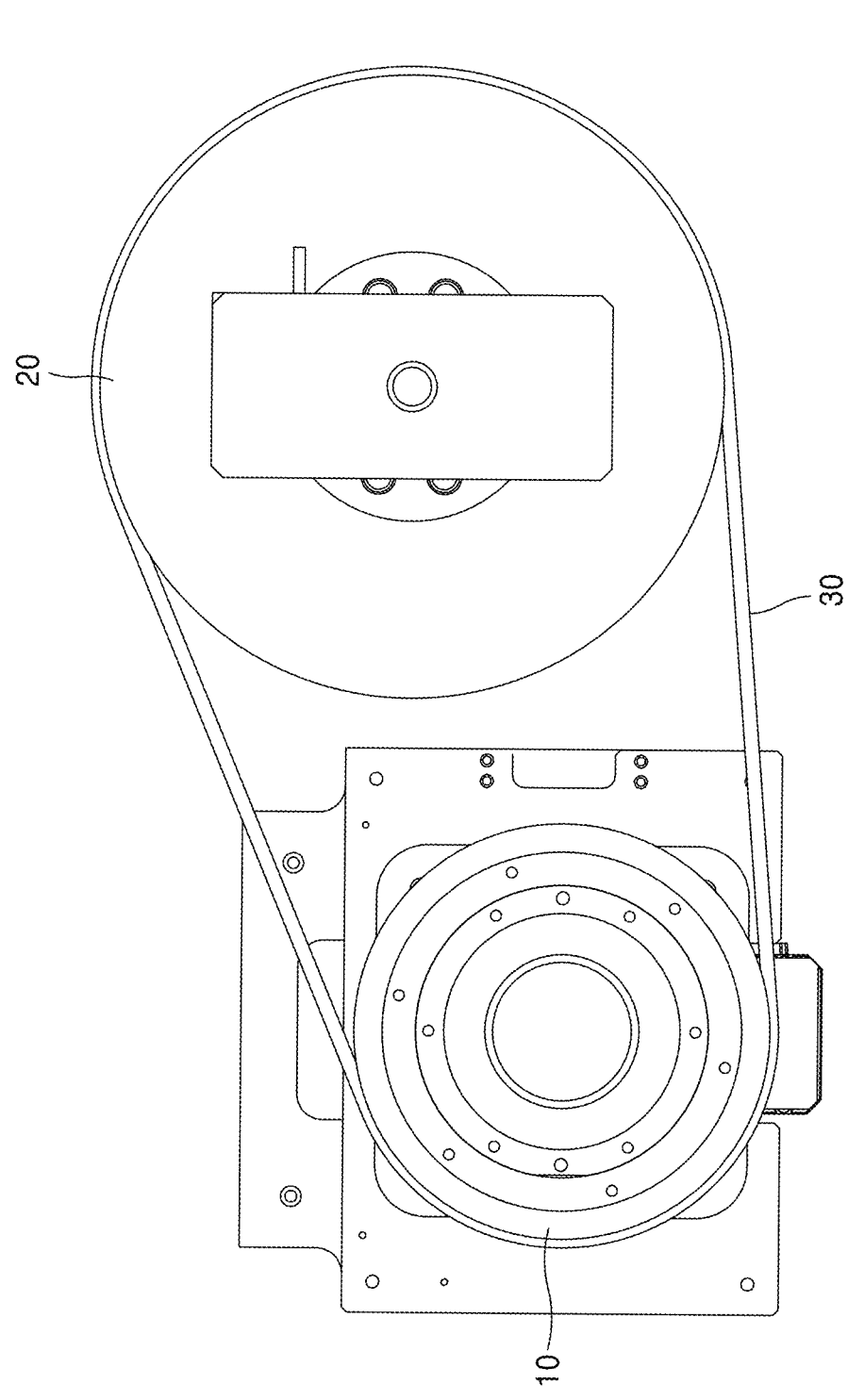
FIG. 1 shows a conventional rotating body inspection apparatus for an electrification component.

Hereinafter, various embodiments of the present disclosure will be described in relation to the accompanying drawings. Various embodiments of the present disclosure may be modified and have various embodiments, and specific embodiments are illustrated in the drawings and a related detailed description is provided. However, this is not intended to limit the various embodiments of the present disclosure to specific embodiments, and should be understood to include all changes and/or equivalents or substitutes included in the spirit and technical scope of the various embodiments of the present disclosure. In connection with the description of the drawings, similar reference numbers have been used for similar components.

The terms "include", "may include", or the like used in various embodiments of the present disclosure indicate the presence of functions, operations, elements, etc., disclosed therein, and does not preclude the presence or addition of one or more functions, operations, elements, etc. Moreover, it should be understood that the terms "include", "have", or the like used in various embodiments of the present disclosure indicate the presence of features, numbers, steps, operations, elements, parts, or a combination thereof described in the specifications, and does not preclude the presence or addition of one or more other features, numbers, steps, operations, elements, parts, or a combination thereof.

When an element is referred to as being "connected" to or by any other element, it should be understood that the element may be directly connected by the other element, but another new element may also be interposed between the element and the other element. Contrarily, when an element is referred to as being "directly connected" or "directly accessed" to or by any other element, it should be understood that there is no new another element between the element and the other element.

The terms used in various embodiments of the present disclosure are for the purpose of describing the particular embodiments only and are not intended to limit the various embodiments of the present disclosure. Singular forms may include plural forms unless apparently indicated otherwise contextually.

All of the terms used herein including technical or scientific terms have the same meanings as those generally understood by those of ordinary skill in the art of various embodiments of the present disclosure, unless they are defined other.

The terms defined in a generally used dictionary should be interpreted as having the same meanings as the contextual meanings of the relevant technology and should not be interpreted as having ideal or exaggerated meanings unless they are clearly defined in the various exemplary embodiments of the present disclosure.

The present disclosure relates to a rotating body inspection apparatus for an electrification component, in which a diameter of a sub sprocket is less than a diameter of a main sprocket and an origin sensor and a position limit sensor are provided in a linear conversion portion to measure a position of the main sprocket.

The rotating body inspection apparatus for the electrification component according to an embodiment of the present disclosure may inspect a rotating body of the electrification component, in which the rotating body according to an embodiment of the present disclosure may be a component that includes a hairpin and rotates.

However, the present disclosure is not limited thereto, and the rotating body according to an embodiment of the present disclosure may be various rotatable components used for the electrification component. Hereinafter, preferred embodiments of the present disclosure will be described with reference to the accompanying drawings.

Figure 2:
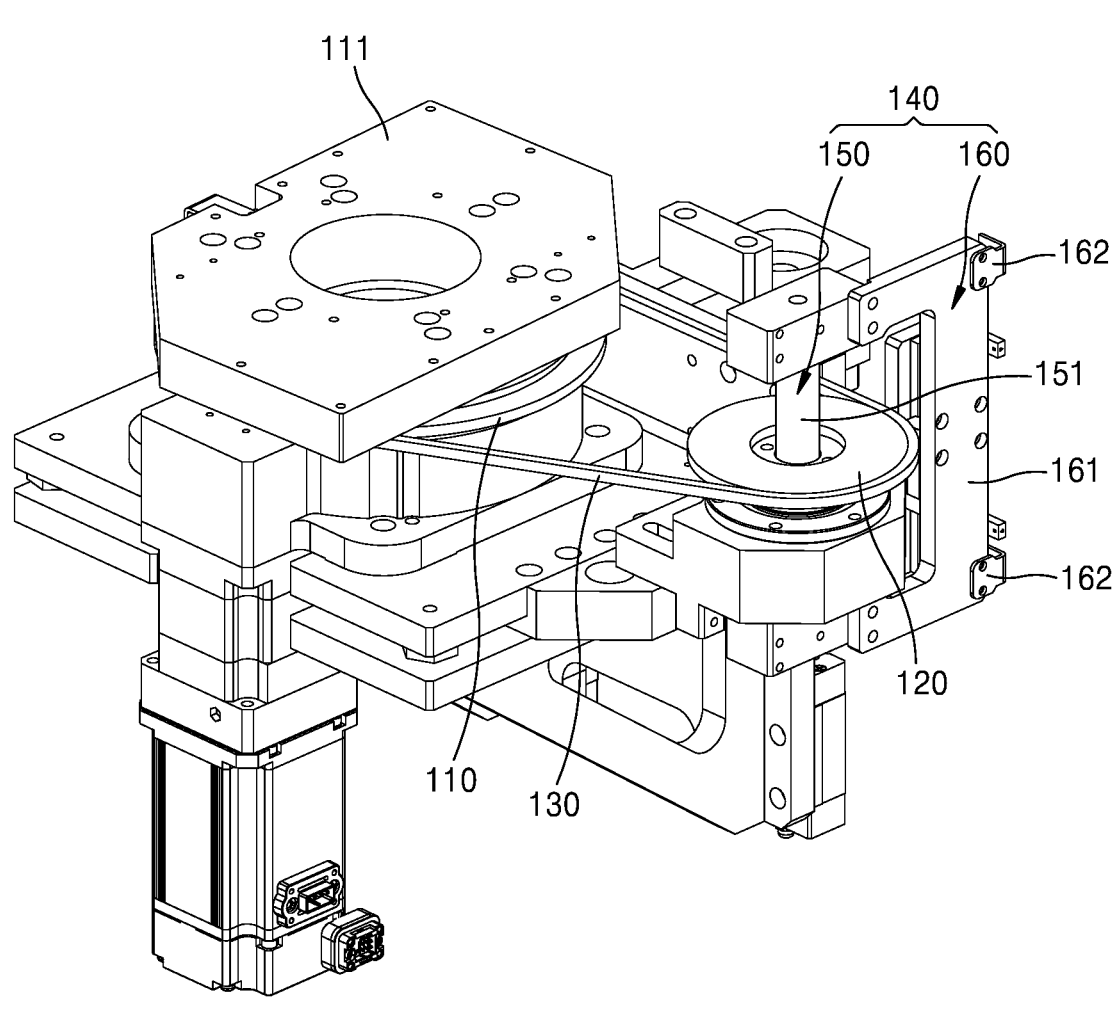
FIG. 2 shows a rotating body inspection apparatus for an electrification component, according to an embodiment of the present disclosure.

Referring to FIG. 2, a rotating body inspection apparatus for the electrification component may include a main sprocket 110, a sub sprocket 120, a connection portion 130, and a linear conversion portion 140.

Figure 3:
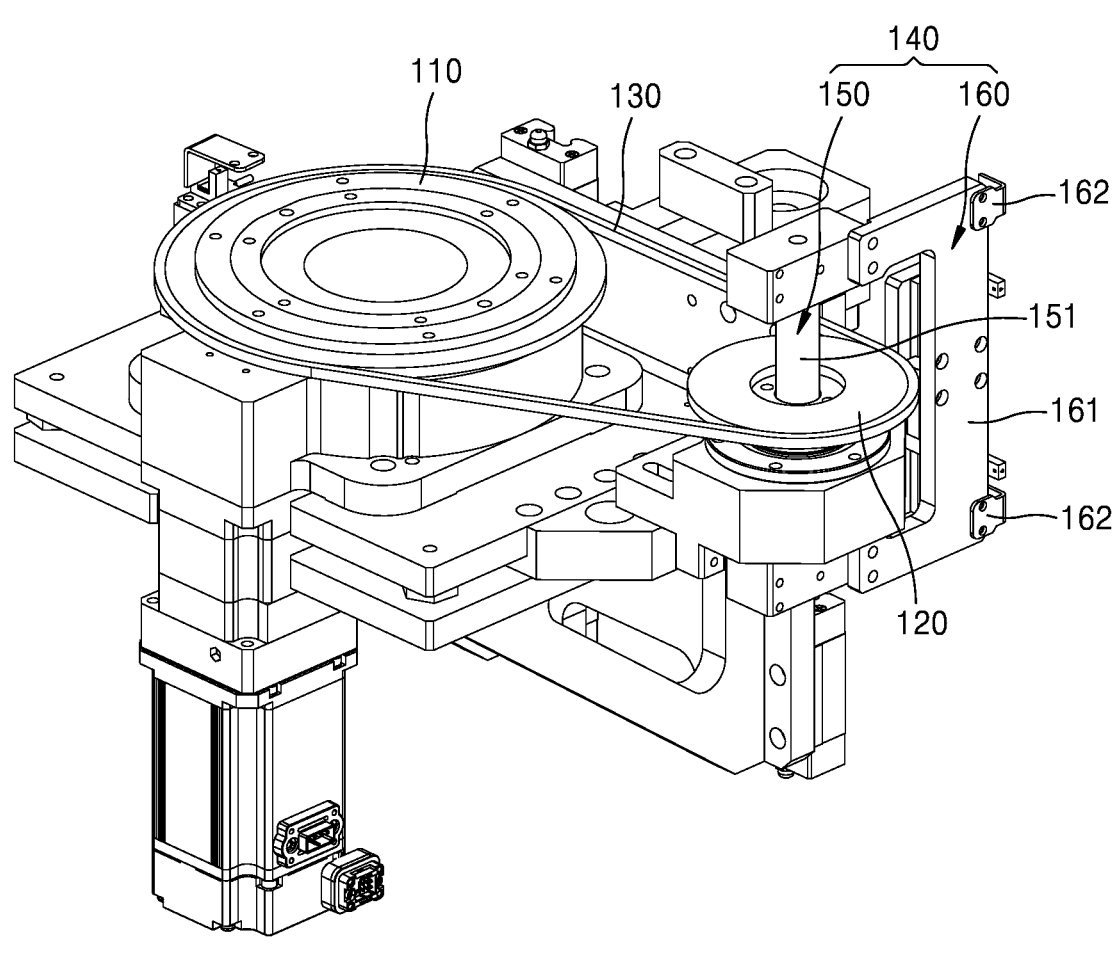
FIG. 3 shows a main sprocket, a sub sprocket, and a linear conversion portion according to an embodiment of the present disclosure.

Referring to FIGS. 2 and 3, a rotating body may be seated on the main sprocket 110 which may be shaped as a disk and rotate. A seating portion 111 may be included in the main sprocket 110, and the rotating body seated on the seating portion 111 may rotate together with the main sprocket 110. As the rotating body is rotated by the main sprocket 110, inspection on the rotating body may be performed.

Figure 4:
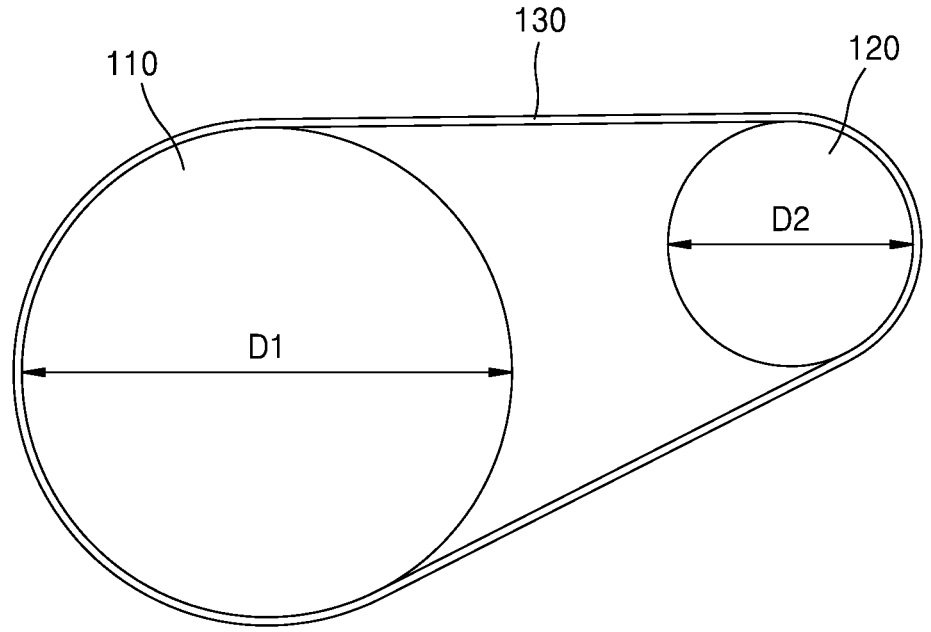
FIG. 4 shows that a diameter of a sub sprocket is less than a diameter of a main sprocket, according to an embodiment of the present disclosure.

The sub sprocket 120 may be shaped as a disk and rotate. Referring to FIG. 4, the connection portion 130 may connect the main sprocket 110 to the sub sprocket 120, and as the main sprocket 110 is connected to the sub sprocket 120 through the connection portion 130, the main sprocket 110 and the sub sprocket 120 may rotate together.

More specifically, the connection portion 130 may include a chain coupled to outer circumferential surfaces of the main sprocket 110 and the sub sprocket 120, and as the main sprocket 110 and the sub sprocket 120 are connected to each other through the connection portion 130 including the chain, the main sprocket 110 and the sub sprocket 120 may rotate together.

However, the connection portion 130 is not limited to the chain, and may include various components as long as they are capable of connecting the main sprocket 110 to the sub sprocket 120.

Figure 5:
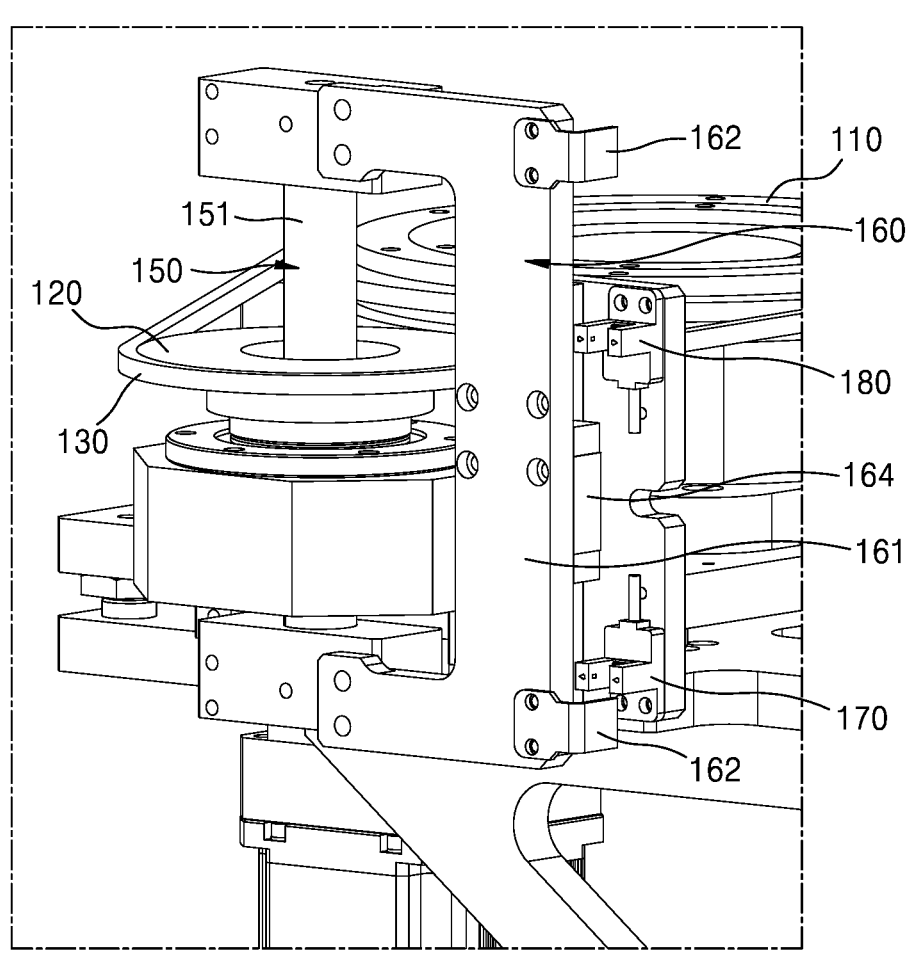
FIG. 5 shows a rotation unit, a linear portion, an origin sensor, and a position limit sensor, according to an embodiment of the present disclosure.

Referring to FIGS. 3 and 5, the linear conversion portion 140 may be connected to the sub sprocket 120 and convert a rotational movement of the sub sprocket 120 into a linear movement.

According to an embodiment of the present disclosure, the linear conversion portion 140 may include a rotation portion 150 and a linear portion 160. The rotation portion 150 may be connected to the sub sprocket 120 and rotate through the sub sprocket 120. The linear portion 160 may be connected to the rotation portion 150 and perform linear reciprocating movement by the rotation of the rotation portion 150.

More specifically, the rotation portion 150 may rotate by the rotation of the sub sprocket 120, and the linear portion 160 connected to the rotation portion 150 may perform linear reciprocating movement by the rotation of the rotation portion 150.

Referring to FIGS. 3 and 5, as the sub sprocket 120 rotates by the rotation of the main sprocket 110, the linear portion 160 may perform linear reciprocating movement by the rotation of the sub sprocket 120.

Herein, when the rotation portion 150 rotates in a direction, the linear portion 160 may linearly move in the direction, and when the rotation portion 150 rotates in the other direction, the linear portion 160 may also linearly move in the other direction.

According to an embodiment of the present disclosure, the rotation portion 150 may include a ball screw 151, and the linear portion 160 may include a linear motion (LM) guide. The rotation portion 150 may include the ball screw 151 having a pitch while forming a thread, and the linear portion 160 may be connected to the ball screw 151.

According to an embodiment of the present disclosure, the linear portion 160 including the LM guide may include a main body 161, a rail 163, and a main body connection portion 164. Referring to FIG. 5, the main body 161 may be connected to the ball screw 151.

The sub sprocket 120 may be connected to a thread of the ball screw 151, and as the sub sprocket 120 rotates, the ball screw 151 moves along the thread of the ball screw 151. As the ball screw 151 moves, the main body 161 connected to the ball screw 151 may move linearly.

Figure 6:
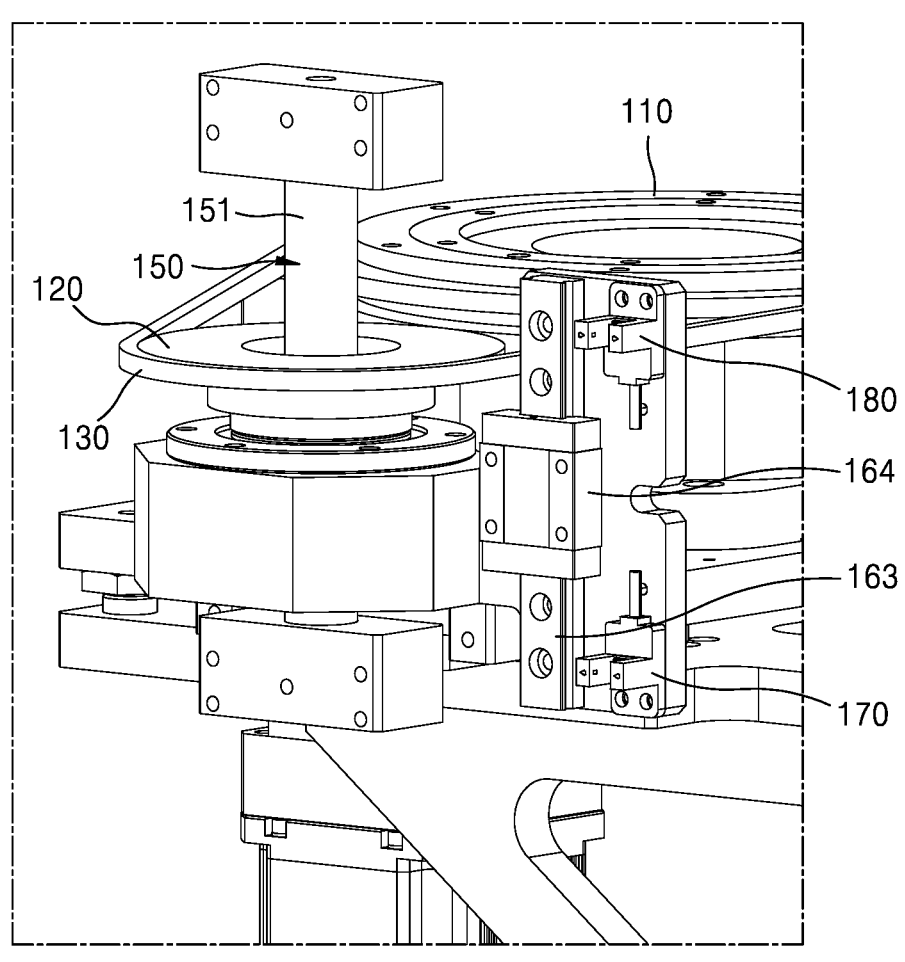
FIG. 6 shows a main body connection portion and a rail in which a main body is removed from a linear portion, according to an embodiment of the present disclosure.

Referring to FIG. 6, the rail 163 may be a linearly extending rail, and the main body connection portion 164 may connect the main body 161 to the rail 163. According to an embodiment of the present disclosure, the main body connection portion 164 may move along the rail 163 and move as one piece with the main body 161.

When the main body 161 moves by the rotation of the sub sprocket 120, the main body connection portion 164 may also move together. The main body connection portion 164 may move along the rail 163, and the main body 161 and the main body connection portion 164 may linearly move by the rail 163 extending linearly.

The rotating body inspection apparatus for the electrification component according to an embodiment of the present disclosure may further include an origin sensor 170 and a position limit sensor 190.

The origin sensor 170 may measure a position of a first point at which the linear portion 160 is located by the linear reciprocating movement of the linear portion 160, and the position limit sensor 180 may measure a position of a second point at which the linear portion 160 is located by the linear reciprocating movement of the linear portion 160.

The origin sensor 170 may detect a position at which the main sprocket 110 starts initial rotation, and the first point at which the linear portion 160 is located may be a position of the linear portion 160 corresponding to a point in time at which the main sprocket 110 starts rotating.

That is, the origin sensor 170 may measure a position at which the linear portion 160 is disposed, at the point in time at which the main sprocket 110 starts rotating.

The position limit sensor 180 may detect a position when the main sprocket 110 rotates one or more turns, and the second point at which the linear portion 160 is located may be a position of the linear portion 160 corresponding to a point in time at which the main sprocket 110 rotates by 370 degrees to 390 degrees, preferably 380 degrees.

That is, the position limit sensor 180 may measure a position at which the linear portion 160 is disposed when the main sprocket 110 rotates more than one turn.

Referring to FIGS. 5 and 6, the origin sensor 170 and the position limit sensor 180 may be disposed in a direction parallel to an axial direction in which the linear portion 160 moves. More specifically, the origin sensor 170 and the position limit sensor 180 may be disposed in a direction parallel to an axial direction in which the may body 161 moves.

The origin sensor 170 and the position limit sensor 180 may include a pair of sensors separated from each other, and the main body 161 may include a recognition unit 162 protruding outwardly from the main body 161.

The recognition unit 162 may be provided on a side and the other side of the main body 161, and may be provided at such a position as to pass through a separating space formed by the pair of sensors included in the origin sensor 170 or the position limit sensor 180 according to a linear movement of the main body 161.

Due to the linear movement of the main body 161, the recognition unit 162 may be inserted into the separating space formed by the pair of sensors provided in the origin sensor 170 which may detect the position of the linear portion 160 by recognizing the insertion of the recognition unit 162 into the separating space.

Moreover, due to the linear movement of the main body 161, the recognition unit 162 may be inserted into the separating space formed by the pair of sensors provided in position limit sensor 180 which may detect the position of the linear portion 160 by recognizing the insertion of the recognition unit 162 into the separating space.

Referring to FIG. 4, the diameter of the sub sprocket 120 of the rotating body inspection apparatus for the electrification component according to an embodiment of the present disclosure may be less than the diameter of the main sprocket 110.

As described above, the origin sensor 170 and the position limit sensor 180 of the rotating body inspection apparatus for the electrification component according to an embodiment of the present disclosure may be disposed in a direction parallel to the axial direction in which the linear portion 160 rather than the sub sprocket 120 moves.

As such, as the origin sensor 170 and the position limit sensor 180 are disposed in the direction parallel to the axial direction in which the linear portion 160 rather than the sub sprocket 120 moves, overlapping may not occur between the origin sensor 170 and the position limit sensor 180 even when the diameter of the sub sprocket 120 is less than the diameter of the main sprocket 110.

More specifically, the rotating body inspection apparatus for the electrification component according to an embodiment of the present disclosure may operate as below. Referring to FIGS. 5 and 6, at a point in time at which the main sprocket 110 starts rotating, the recognition unit 162 included on a side (a lower portion in FIG. 5) of the main body 161 may be inserted into the separating space between the pair of sensors included in the origin sensor 170.

The origin sensor 170 may measure the position of the first point at which the linear portion 160 is located, and when the recognition unit 162 provided on a side of the main body 161 is inserted into the separating space between the pair of sensors, the origin sensor 170 may detect that the position is a point at which the main sprocket 110 starts rotating (the first point at which the linear portion 160 is located.

When the main sprocket 110 rotates, the sub sprocket 120 connected to the main sprocket 110 through the connection portion 130 may also rotate, and as the sub sprocket 120 rotates, the rotation portion 150 may rotate.

When the rotation portion 150 rotates, the linear portion 160 may perform a linear movement, and thus the main body 161 may move linearly. When the main sprocket 110 rotates as much as a rotation angle required for the rotating body, the recognition unit 162 included on the other side (an upper portion in FIG. 5) of the main body 161 may be inserted into the separating space between the pair of sensors included in the position limit sensor 180.

The position limit sensor 180 may measure the position of the second point at which the linear portion 160 is located, and when the recognition unit 162 provided on the other side of the main body 161 is inserted into the separating space between the pair of sensors, the position limit sensor 180 may detect that the main sprocket 110 rotates one or more turns.

Herein, the second point of the linear portion 160 detected by the position limit sensor 180 may be a position of the linear portion 160 corresponding to a point in time at which the main sprocket 110 rotates by 370 degrees to 380 degrees, and when the recognition unit 162 provided on the other side of the main body 161 is inserted into the position limit sensor 180, the position limit sensor 180 may detect that the main sprocket 110 rotates by 370 degrees to 390 degrees.

In this way, as one or more turns of rotation of the main sprocket 110 is detected through the position limit sensor 180, rotation of the main sprocket 110 may be limited.

As described above, in the rotating body inspection apparatus for the electrification component according to an embodiment of the present disclosure, as the origin sensor 170 and the position limit sensor 180 are disposed in the direction parallel to the axial direction in which the linear portion 160 rather than the sub sprocket 120 moves, the diameter of the sub sprocket 120 may be reduced, thereby miniaturizing the inspection apparatus.

According to an embodiment of the present disclosure, a rotation angle of one or more turns of the main sprocket 110 may be 370 degrees to 390 degrees, preferably, 380 degrees. However, the rotation angle of one or more turns of the main sprocket 110 may change according to the rotation angle required for the rotating body.

According to an embodiment of the present disclosure, the position of the position limit sensor 180 may be changed depending on the rotation angle of the rotating body. More specifically, the rotation angle of one or more turns of the main sprocket 110 may be changed according to the rotation angle required for the rotating body, such that the position of the position limit sensor 180 may be changed.

More specifically, the position of the position limit sensor 180 may be changed depending on when the rotation angle of one or more turns of the main sprocket 110 is 370 degrees, 380 degrees, or 390 degrees. However, when the position of the position limit sensor 180 is changed, the position limit sensor 180 may be changed within a direction parallel to the axial direction in which the linear portion 160 moves.

According to an embodiment of the present disclosure, the position of the origin sensor 170 may also be changed as needed. More specifically, to change the position of the linear portion 160 corresponding to the point in time at which the main sprocket 110 starts rotating, the position of the origin sensor 170 may also be changed. However, when the position of the origin sensor 170 is changed, the origin sensor 170 may be changed within the direction parallel to the axial direction in which the linear portion 160 moves.

That is, according to an embodiment of the present disclosure, a position of any one or more of the origin sensor 170 and the position limit sensor 180 may be changed with the rotation angle of the rotating body.

Referring to FIG. 6, a distance between the origin sensor 170 and the position limit sensor 180 according to an embodiment of the present disclosure may be equal to 1.027 to 1.083 times of a product of a diameter D1 of the main sprocket 110 with respect to a diameter D2 of the sub sprocket 120 and the distance the linear portion 160 moves by one turn of a rotation of the sub sprocket 120.

As described above, the positions of the origin sensor 170 and the position limit sensor 180 may be changed according to the rotation angle of the rotating body, such that the origin sensor 170 and the position limit sensor 180 have to maintain a specific distance or longer therebetween according to the rotation angle of the rotating body.

According to an embodiment of the present disclosure, one or more turns of rotation of the main sprocket 110 may correspond to the rotation angle of the rotating body, and the rotation angle of the main sprocket 110 may be 370 degrees to 390 degrees.

More specifically, when the rotating body is inspected, the rotating body may not rotate by exactly one turn (360 degrees), such that the main sprocket 110 needs to rotate an angle greater than one turn (360 degrees). Thus, the rotation angle of the main sprocket 110 may be preferably greater than 370 degrees, more preferably, 380 degrees.

When the rotation angle of the main sprocket 110 is 370 degrees, the number of turns of rotation of the main sprocket 110 may be equal to 370/360=1.027 turns. When the rotation angle of the main sprocket 110 is 380 degrees, the number of turns of rotation of the main sprocket 110 may be equal to 380/360=1.056 turn.

The number of turns of rotation of the main sprocket 110 and the number of turns of rotation of the sub sprocket 120 may be inversely proportional to the diameters of the main sprocket 110 and the sub sprocket 120, such that when the main sprocket 110 rotates 1.027 turns, the number of turns of rotation of the sub sprocket 120 may be equal to (D1/D2)×1.027.

By multiplying the distance the linear portion 160 moves by one turn of a rotation of the sub sprocket 120 by the number of turns of rotation of the sub sprocket 120, a distance the linear portion 160 moves may be derived.

A distance between the origin sensor 170 and the position limit sensor 180 may be equal to the moving distance of the linear portion 160. More specifically, when the main sprocket 110 rotates from 0 degree to 370 degrees, the origin sensor 170 may have to detect that the main sprocket 110 is at 0 degree (a rotation start point) and the position limit sensor 180 may have to detect 370-degree rotation of the main sprocket 110.

When the main sprocket 110 rotates from 0 degree to 370 degrees, a moving distance of the linear portion 160 may be equal to "(D1/D2)×1.027×the distance the linear portion 160 moves by one turn of a rotation of the sub sprocket 12", such that the distance between the origin sensor 170 and the position limit sensor 180 may be equal to "(D1/D2)×1.027× the distance the linear portion 160 moves by one turn of a rotation of the sub sprocket 12".

In addition, when the main sprocket 110 rotates from 0 degree to 380 degrees, the moving distance of the linear portion 160 may be equal to "(D1/D2)×1.056×the distance the linear portion 160 moves by one turn of a rotation of the sub sprocket 12", such that the distance between the origin sensor 170 and the position limit sensor 180 may be equal to "(D1/D2)×1.056×the distance the linear portion 160 moves by one turn of a rotation of the sub sprocket 12".

Herein, the distance the linear portion 160 moves by one turn of a rotation of the sub sprocket 120 may be equal to a distance the main body 161 moves by one turn of a rotation of the sub sprocket 120.

According to an embodiment of the present disclosure, the main sprocket 110 has to be greater than at least 370 degrees while the positions of the origin sensor 170 and the position limit sensor 180 are adjustable, such that the distance between the origin sensor 170 and the position limit sensor 180 has to be greater than "(D1/D2)×1.027×the distance the linear portion 160 moves by one turn of a rotation of the sub sprocket 12".

The distance between the origin sensor 170 and the position limit sensor 180 may be changed correspondingly even if an angle required for the rotating body is changed, when the distance between the origin sensor 170 and the position limit sensor 180 is greater than "(D1/D2)×1.027× the distance the linear portion 160 moves by one turn of a rotation of the sub sprocket 12".

Preferably, the distance between the origin sensor 170 and the position limit sensor 180 may be equal to "(D1/D2)× 1.056×the distance the linear portion 160 moves by one turn of a rotation of the sub sprocket 12" corresponding to a case where the main sprocket 110 rotates from 0 degree to 380 degrees.

When the distance between the origin sensor 170 and the position limit sensor 180 is excessively great, the inspection apparatus may not be miniaturized. Thus, the distance between the origin sensor 170 and the position limit sensor 180 may be preferably less than a distance corresponding to a case where the main sprocket 110 rotates from 0 degree to 390 degrees.

More specifically, when the main sprocket 110 rotates by 390 degrees, the number of turns of rotation of the main sprocket 110 may be equal to 390/360=1.083 turn, and the distance between the origin sensor 170 and the position limit sensor 180 may be preferably equal to "(D1/D2)×1.083×the distance the linear portion 160 moves by one turn of a rotation of the sub sprocket 12" corresponding to a case where the main sprocket 110 rotates from 0 degree to 390 degrees.

That is, the distance between the origin sensor 170 and the position limit sensor 180 according to an embodiment of the present disclosure may be preferably equal to 1.027 times to 1.083 times of a product of the diameter D1 of the main sprocket 110 with respect to the diameter D2 of the sub sprocket 120 and the distance the linear portion 160 moves by one turn of a rotation of the sub sprocket 120, so as to miniaturize the inspection apparatus (390 degrees) while allowing one or more turns of rotation of the main sprocket 110 (370 degrees).

Figure 7:
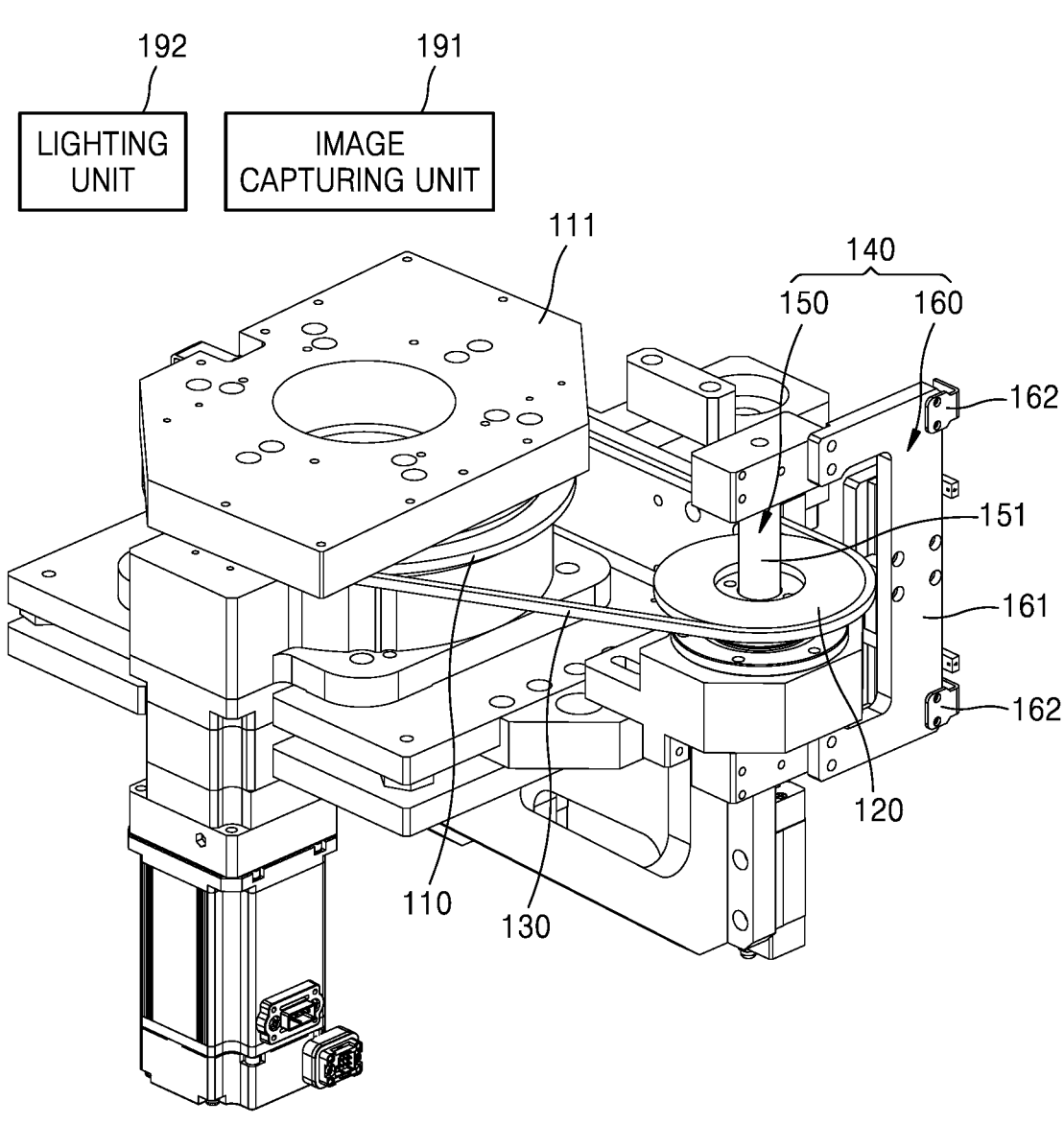
FIG. 7 shows an image capturing unit and a lighting unit, according to an embodiment of the present disclosure.

Referring to FIG. 7, the rotating body inspection apparatus for the electrification component according to an embodiment of the present disclosure may further include an image capturing unit 191 and a lighting unit 192. The image capturing unit 191 may be provided on the main sprocket 110 and photograph the rotating body seated on the main sprocket 110. The lighting unit 192 may irradiate light to the rotating body seated on the main sprocket 110.

The rotating body inspection apparatus for the electrification component according to an embodiment of the present disclosure may perform inspection on the rotating body through the optical system and the lighting system, and to this end, the rotating body inspection apparatus for the electrification component according to an embodiment of the present disclosure may further include the image capturing unit 191 and the lighting unit 192.

The rotating body inspection apparatus for the electrification component according to an embodiment of the present disclosure described above may have effects as below.

In the rotating body inspection apparatus for the electrification component according to the present disclosure, the diameter of the sub sprocket is less than the diameter of the main sprocket and the origin sensor and the position limit sensor are provided in the linear conversion portion, thereby miniaturizing the rotating body inspection apparatus for the electrification component and making it easy to mount the sensors thereon.

Moreover, the rotating body inspection apparatus for the electrification component according to an embodiment of the present disclosure may rotate the main sprocket at high speed by making the diameter of the sub sprocket less than the diameter of the main sprocket, thereby minimizing the track time.

Furthermore, the rotating body inspection apparatus for the electrification component according to an embodiment of the present disclosure may change a position of any one of the origin sensor and the position limit sensor depending on the rotation angle required for the rotating body, thereby removing a need to manufacture a new sub sprocket due to a change of the rotation angle required for the rotating body.

So far, the present disclosure has been described in detail with preferred embodiments, but the present disclosure is not limited to the above embodiments, and various modifications may be made without departing from the scope of the present disclosure. Accordingly, the true technical scope of the present disclosure should be defined by the technical spirit of the appended claims.

The invention claimed is:

1. A rotating body inspection apparatus for an electrification component, the rotating body inspection apparatus comprising:
    a main sprocket on which a rotating body is seated and which is shaped as a disk and rotates;
    a sub sprocket shaped as a disk and rotating;
    a connection portion connecting the main sprocket to the sub sprocket;
    a linear conversion portion which is connected to the sub sprocket and which converts a rotational movement into a linear movement,
    wherein a diameter of the sub sprocket is less than a diameter of the main sprocket,
    wherein the linear conversion portion comprises:
    a rotation portion connected to the sub sprocket and rotating by the sub sprocket; and
    a linear portion connected to the rotation portion and making a linear reciprocating movement in response to a rotation of the rotation portion, and the sub sprocket rotates in response to a rotation of the main sprocket, and the linear portion makes a linear reciprocating movement in response to a rotation of the sub sprocket;
    the rotation body inspection apparatus further comprising an origin sensor configured to measure a position of a first point at which the linear portion is located according to the linear reciprocating movement of the linear portion; and
    a position limit sensor configured to measure a position of a second point at which the linear portion is located according to the linear reciprocating movement of the linear portion,
    wherein the origin sensor and the position limit sensor are disposed in a direction parallel to an axial direction in which the linear portion moves, and
    a position of any one or more of the origin sensor and the position limit sensor is changeable according to a rotation angle of the rotating body.

2. The rotating body inspection apparatus of claim 1, further comprising:
    an image capturing unit provided on the main sprocket and photographing the rotating body seated on the main sprocket; and
    a lighting unit irradiating light to the rotating body seated on the main sprocket.

3. The rotating body inspection apparatus of claim 1, wherein the rotation portion comprises a ball screw, and the linear portion comprises a linear motion (LM) guide.

4. The rotating body inspection apparatus of claim 1, wherein the first point at which the linear portion is located is a position of the linear portion corresponding to a point in time at which the main sprocket starts rotating, and
    the second point at which the linear portion is located is a position of the linear portion corresponding to a point in time at which the main sprocket rotates by 370 degrees to 390 degrees.

5. The rotating body inspection apparatus of claim 1, wherein a distance between the origin sensor and the position limit sensor is equal to 1.027 times to 1.083 times of a product of a diameter (D1) of the main sprocket with respect to a diameter (D2) of the sub sprocket and a distance the linear portion moves by one turn of a rotation of the sub sprocket.

* * * * *